United States Patent
Johnson et al.

[19]

[11] Patent Number: 6,130,136
[45] Date of Patent: Oct. 10, 2000

[54] BIPOLAR TRANSISTOR WITH L-SHAPED BASE-EMITTER SPACER

[75] Inventors: Frank S. Johnson, Richardson; Peter S. McAnally, McKinney, both of Tex.

[73] Assignee: Texas Instruments Incorporated, Dallas, Tex.

[21] Appl. No.: 09/196,376

[22] Filed: Nov. 19, 1998

[51] Int. Cl.[7] .................................................. H01L 21/301
[52] U.S. Cl. .......................... 438/365; 438/368; 438/370; 438/738
[58] Field of Search ..................................... 438/365, 368, 438/366, 309, 364, 370, 738

[56] References Cited

U.S. PATENT DOCUMENTS

| | | | |
|---|---|---|---|
| 4,988,632 | 1/1991 | Pfiester | 438/368 |
| 5,213,989 | 5/1993 | Fitch et al. | 438/365 |
| 5,804,486 | 9/1998 | Zambrano et al. | 438/368 |
| 5,940,711 | 8/1999 | Zambrano | 438/368 |

*Primary Examiner*—Tuan H. Nguyen
*Attorney, Agent, or Firm*—Wade James Brady, III; Frederick J. Telecky, Jr.

[57] ABSTRACT

A method for fabricating a spacer in a transistor. The method comprises the steps of forming a stepped feature 384, 386 at a surface of a semiconductor body 340, the stepped feature having a lateral face substantially parallel to the surface and an angled face substantially perpendicular to the surface. An insulating layer 410 is formed over the lateral and angled faces of the stepped feature 384, 386 and a sacrificial layer 404 is formed over the insulating layer and over the lateral and angled faces of the stepped feature. The portion of the sacrificial layer over the lateral face is removed to expose portions of the insulating layer and to leave a portion of the sacrificial layer to cover the angled face of the stepped feature. Finally, the exposed portions of the insulating layer are removed to leave an L-shaped insulator layer, such as may be useful to insulate the base electrode from the emitter electrode in a bipolar transistor.

16 Claims, 7 Drawing Sheets

BIPOLAR TRANSISTOR WITH L-SHAPED BASE-EMITTER SPACER

FIELD OF THE INVENTION

This invention relates to semiconductor devices, and more specifically to bipolar transistors.

BACKGROUND OF THE INVENTION

Bipolar transistors are commonly used in semiconductor devices, especially for high-speed operation and large drive current applications. A double polysilicon bipolar transistor 10 is shown in FIG. 1. The active area for the transistor is isolated by shallow trench isolation regions 12. The collector 13 is a lightly doped region of one conductivity type in epitaxial layer 14, and the base region is formed by doped regions 16 and 18 of the opposite conductivity type. A heavily doped buried layer 15 lies beneath the collector 13 and is doped the conductivity type of the collector. Doped region 16 is called the intrinsic base region because it lies directly between the emitter and collector of the transistor. Region 18, on the other hand, is known as the extrinsic base region. The extrinsic base region 18 provides an area for connecting to the base of the transistor. The base electrode 20 comprises a first doped polysilicon layer. The emitter region 22 is a doped region of the same conductivity type as the collector and is located within the intrinsic base region 16. The emitter electrode 24 is formed with a second doped polysilicon layer. Contact to the buried layer 15 is made by a heavily-doped collector contact implanted region 28. Oxide region 26 and base-emitter spacers 28 insulate the emitter electrode 24 from the base electrode 20.

The design of the collector of a bipolar transistor influences both its breakdown and high-frequency characteristics. In general a thicker, more lightly-doped collector provides a higher collector-emitter breakdown voltage (BVceo), whereas a thinner, more heavily-doped collector reduces base pushout (Kirk effect) and provides a higher cutoff frequency ($f_T$). Much emphasis has been placed on improving $f_T$ in the prior art. For example, in Japanese Patent Application No. 63-154721 a recess is etched in the epitaxial layer in which the collector and base are formed to thin the collector layer between the intrinsic base and a buried layer. In another approach, a phosphorus implant beneath the intrinsic base suppresses base pushout and improves $f_T$. See Sugiyama, et al., "A 40 GHz $f_T$ Si Bipolar Transistor LSI Technology," 1989 IEEE International Electron Devices Meeting Technical Digest, 9.1.1. These techniques, however, result in transistors with low BVceo. The Sugiyama paper, for example, reports a BVceo of only 3.3 Volts.

In contrast, the prior art transistor shown in FIG. 2 is designed for high BVceo. The transistor is identical to that of FIG. 1, except that the n+ buried layer is omitted. This, however, increases both the vertical and horizontal components of the collector resistance. High collector resistance can result in the transistor going into saturation at high collector currents, which can induce latchup by injecting holes into the substrate.

The BVceo and $f_T$ of a bipolar transistor have traditionally been subject to a performance trade-off. In other words, transistors designed to operate as power devices typically do not perform well in applications requiring small-signal amplification, whereas transistors designed to amplify small signals typically do not perform well in high-power conditions. As a result, the integrated circuit designer is often forced to compromise or trade off the performance of one type of circuit (e.g. input/output) in the integrated circuit against another type of circuit (e.g. small signal amplifier). Therefore, a need exists for structures and methods that allow for transistors designed for both high BVceo and high $f_T$ to be formed on the same monolithic integrated circuit. It is also desirable that both types of transistors be formed in a cost-effective manner without added process steps.

In typical double polysilicon bipolar transistors, the emitter junction 22 in FIG. 1 is formed by implantation and subsequent diffusion of a dopant from the polysilicon contact 24. A fraction of the emitter dopant implant is blocked from reaching the polysilicon contacting the single-crystal silicon region by the portion of the polysilicon contact 24 deposited on the vertical surface of the base-emitter spacer 28. Since the average dose of dopant diffusing through the polysilicon-silicon interface along the entire length of the emitter surface is a function of the ratio of the width of the implanted planar fraction of the polysilicon to the width of the nonimplanted polysilicon on the vertical surface of the base-emitter spacers, the emitter diffusion profile and average junction depth becomes a function of the lithographically-defined emitter width. This effect is typically most severe for extremely narrow emitters with lithographically-defined widths less than approximately four times the thickness of the polysilicon contact 24. In this case, the gain of the transistor also becomes a function of the emitter width and the transistor is said to suffer from narrow-emitter effects.

In order to achieve a consistent gain for all the transistors used within a circuit, it is desired that this emitter diffusion 22 extend an equal distance into the single-crystalline silicon for all bipolar transistors on a single silicon substrate, independent of the dimensions of the lithographically-defined emitter region. One method of achieving this size independence of the emitter junction and the transistor gain is by forming an "L"-shaped base-emitter spacer that allows the volume of the vertically-deposited emitter polysilicon to reside within the "L" and outside of the region above the active emitter. This situation allows an implanted region to be formed directly above the entire length of the emitter junction. An additional advantage to the use of an "L"-shaped spacer is that the width of the planar portion of polysilicon located directly above the intrinsic emitter region becomes larger for a given patterned emitter size. This increases the area for creating a low-resistance emitter contact and reduces the susceptibility of the contact to being fully or partially blocked by parasitic spacers formed in the emitter contact region during subsequent CMOS source-drain spacer processing steps.

The "L" spacer is typically formed by the low-pressure chemical vapor deposition (LPCVD) of a stack film of oxide/nitride/oxide and a combination of selective wet and dry etching of the layers. However, the dimensions of an "L"-shaped spacer formed by this method are limited by the etching selectivities between the LPCVD oxide, LPCVD nitride, and a previously-formed thermal oxide layer. Typically, an "L"-shaped spacer with a thin enough body to completely contain the vertically-deposited polysilicon cannot be reliably manufactured. A need exists for a fabrication method to form thin-bodied "L"-shaped spacers reliably.

SUMMARY OF THE INVENTION

In accordance with an embodiment of the invention, there is disclosed a method for fabricating a spacer in a transistor. The method comprises the steps of forming a stepped feature at a surface of a semiconductor body, the stepped feature having a lateral face substantially parallel to the surface and an angled face substantially perpendicular to the surface. An insulating layer is formed over the lateral and angled faces of the stepped feature and a sacrificial layer is formed over the insulating layer and over the lateral and angled faces of the stepped feature. The sacrificial layer has an anisotropic or dry etch selectivity ratio to the insulating layer of at least two to one, and an isotropic or wet etch selectivity to thermal oxide of at least five to one. In one embodiment, the sacrificial layer is a phosphorus-containing layer. In other embodiments, the sacrificial layer is phosphosilicate glass or borophosphosilicate glass. The portion of the sacrificial layer over the lateral face is removed to expose portions of the insulating layer and to leave a portion of the sacrificial layer to cover the angled face of the stepped feature. Finally, the exposed portions of the insulating layer are removed to leave an L-shaped insulator layer, such as may be useful to insulate the base electrode from the emitter electrode in a bipolar transistor.

In accordance with another embodiment of the invention, there is disclosed a method for fabricating a bipolar transistor. The method includes the steps of forming a base electrode at a surface of a semiconductor body, the base electrode extending from the surface and having a face substantially perpendicular to the surface; forming a doped base region at the surface, the base region substantially aligned with the base electrode face; forming an insulating layer over the surface and the base electrode, the insulating layer covering the face of the base electrode. A sacrificial layer is formed over the insulating layer and over the surface and the base electrode. In one embodiment, the sacrificial layer is a phosphorus-containing layer. In other embodiments, the sacrificial layer is phosphosilicate glass or borophosphosilicate glass. The sacrificial layer covers the insulating layer covering the face of the base electrode. The sacrificial layer is removed from the surface and the base electrode, leaving the sacrificial layer covering the insulating layer covering the face of the base electrode. Portions of the insulating layer left uncovered by the sacrificial layer are then removed and the remaining portions of the sacrificial layer are then removed. An emitter electrode is then formed at the surface, wherein the insulating layer insulates the base electrode from the emitter electrode.

An advantage of the inventive concepts is that the spacer may be formed without substantially etching the surface of the semiconductor body or the passivating oxide of the base-emitter junction.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 1:
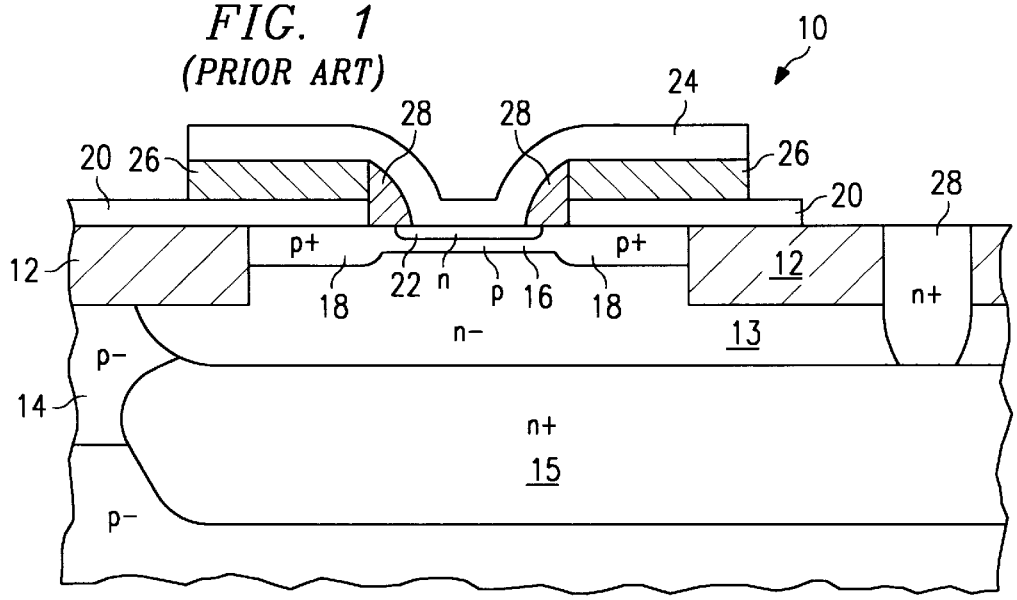
FIG. 1 is a cross-sectional diagram of a prior art double polysilicon bipolar transistor.
Figure 2:
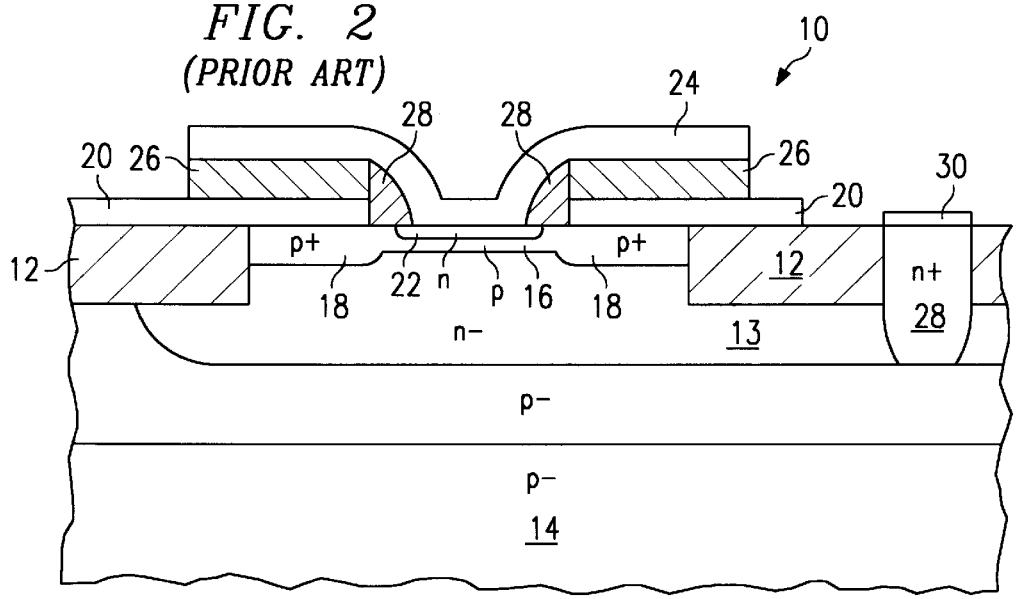
FIG. 2 is a cross-sectional diagram of a prior art double polysilicon bipolar transistor designed for high breakdown voltage characteristics.
Figure 3A:
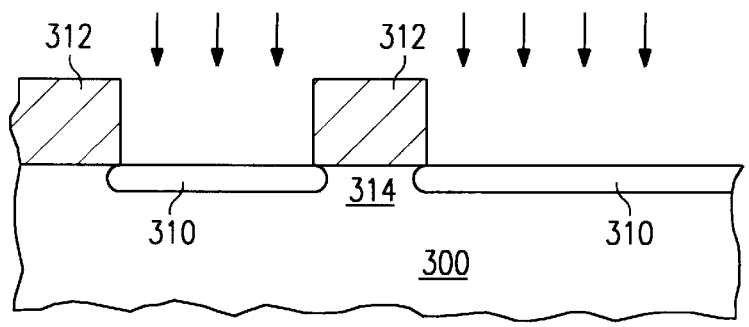
FIGS. 3a to 3n are cross-sectional diagrams of a transistor in accordance with a first embodiment of the invention at various stages during fabrication.
Figure 3B:
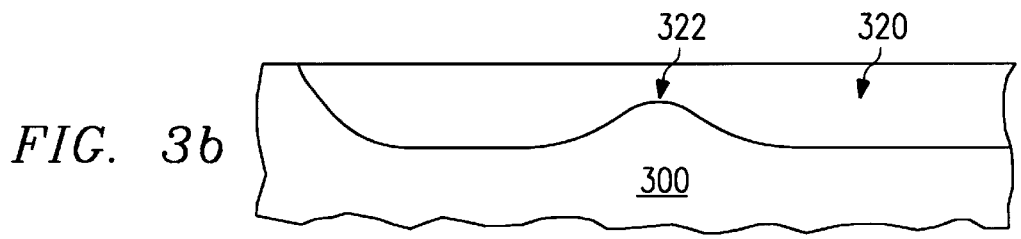
Figure 3C:
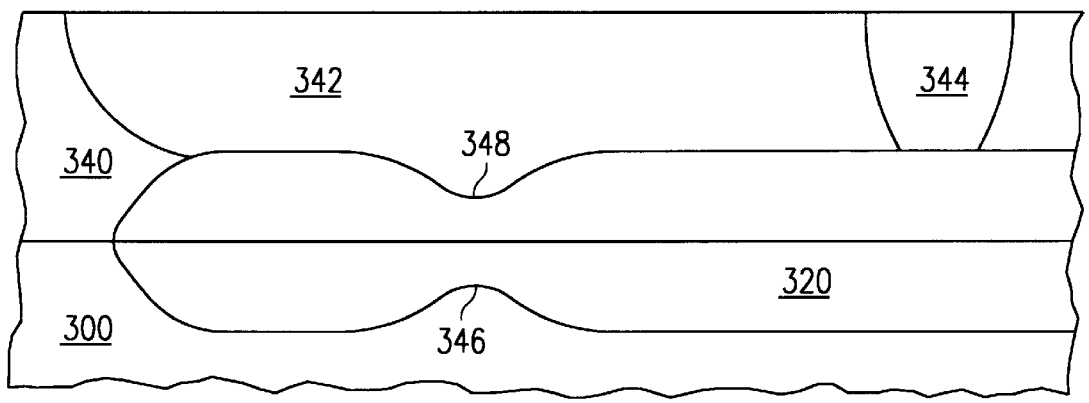
Figure 3D:
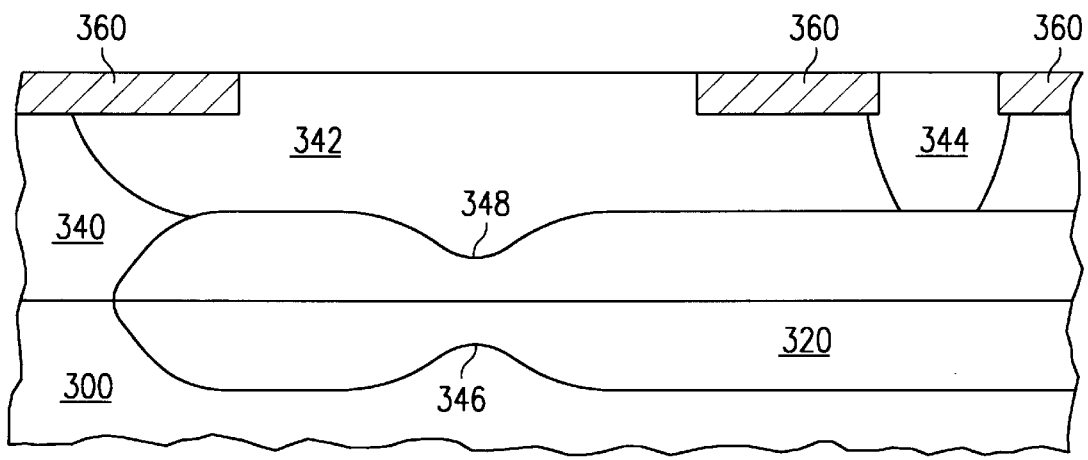
Figure 3E:
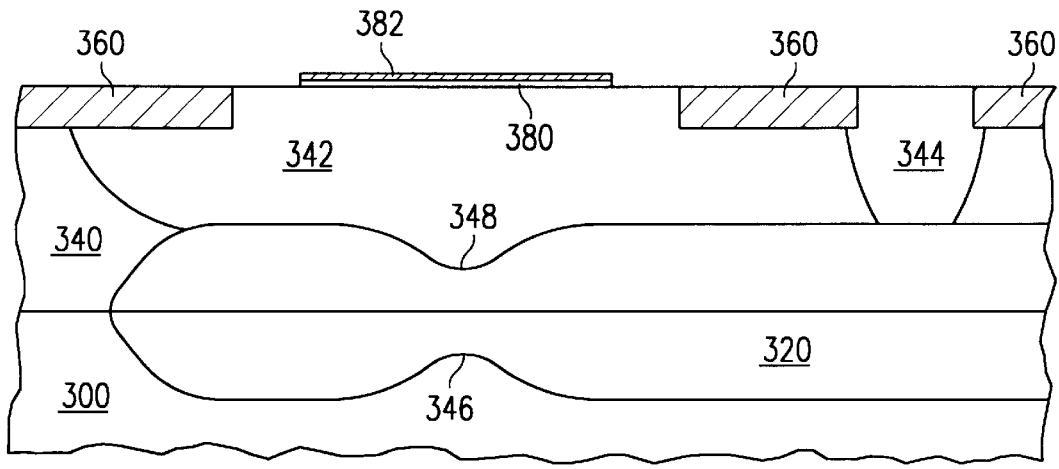
Figure 3F:
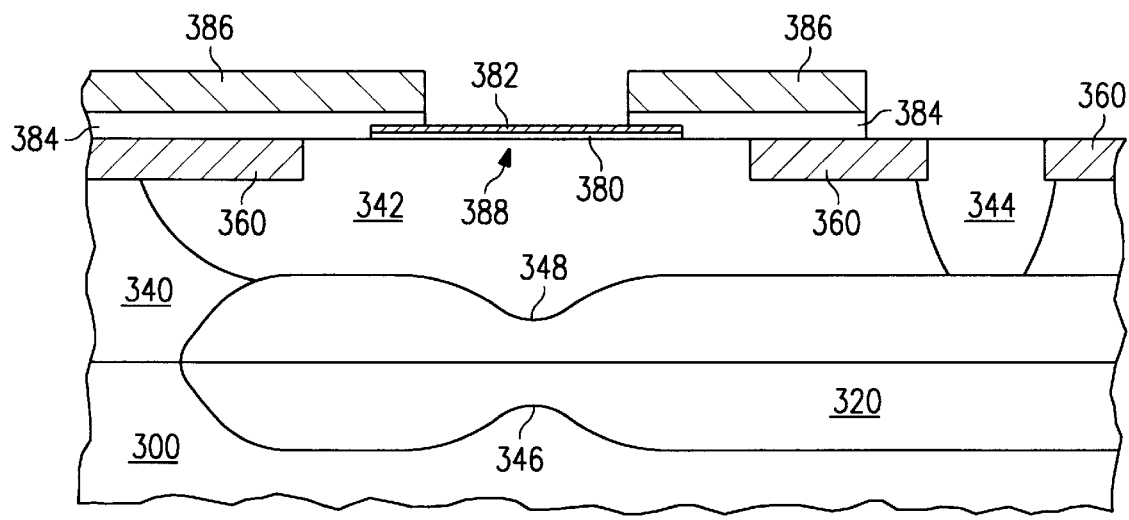
Figure 3G:
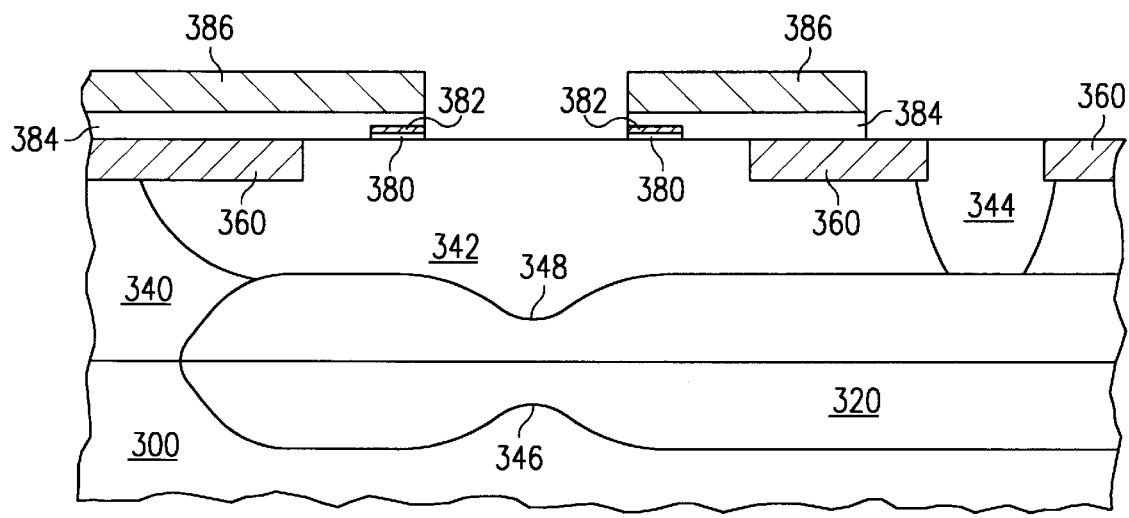
Figure 3H:
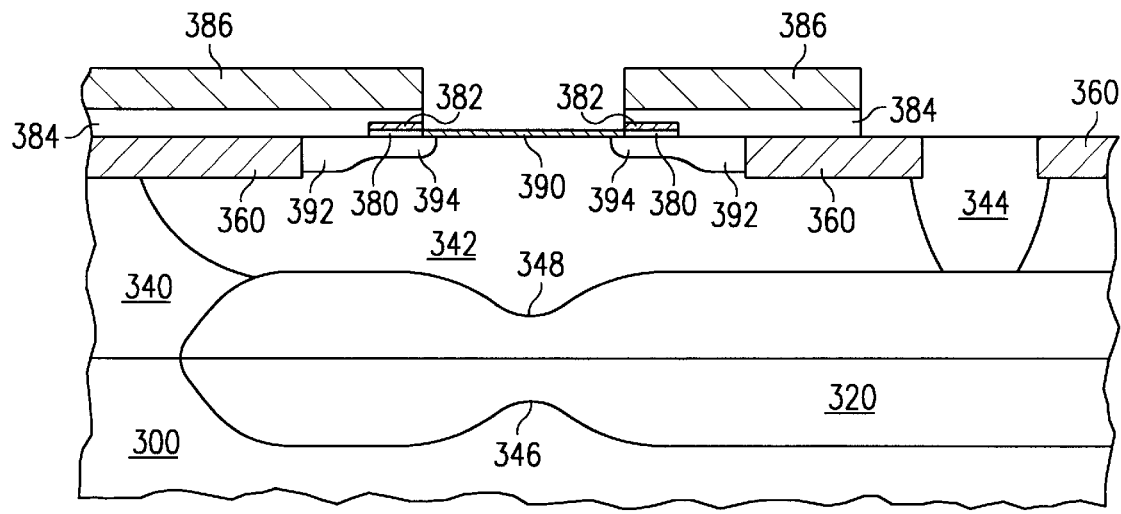
Figure 3I:
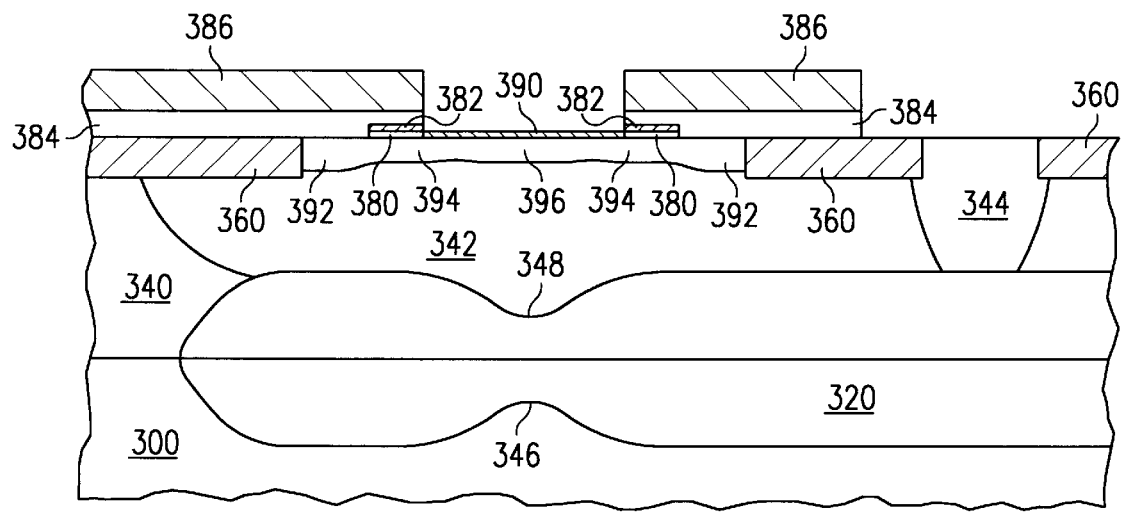
Figure 3J:
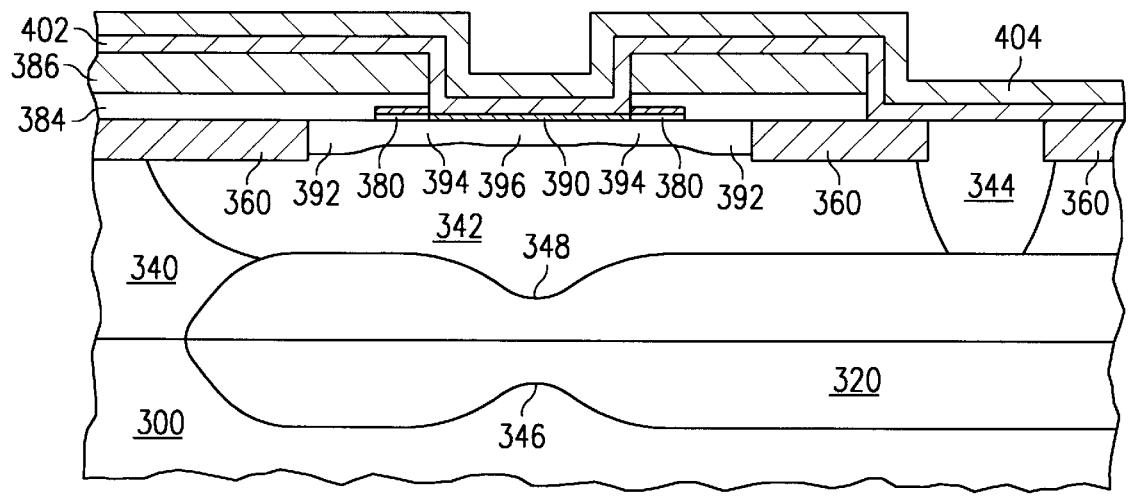
Figure 3K:
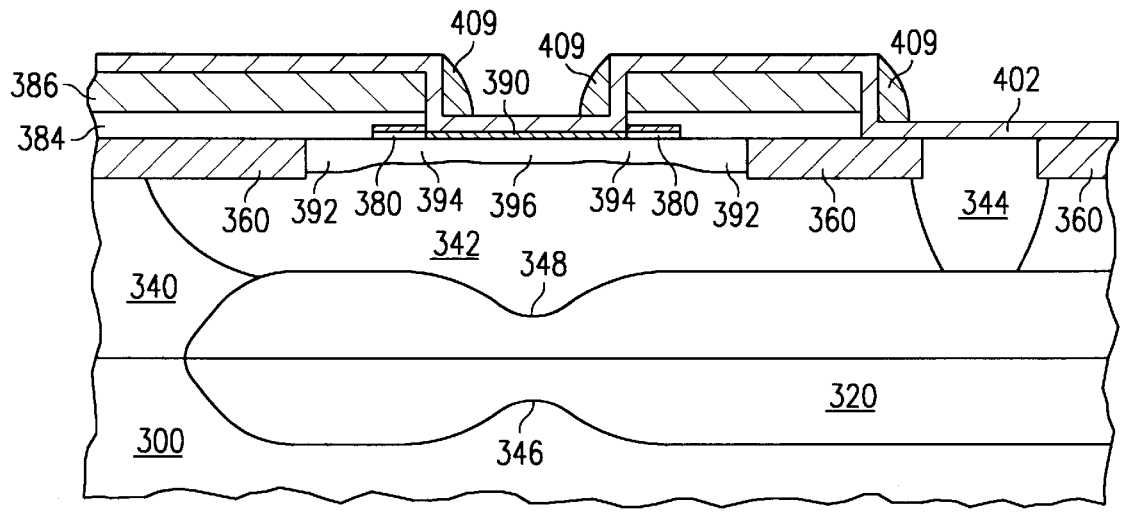
Figure 3L:
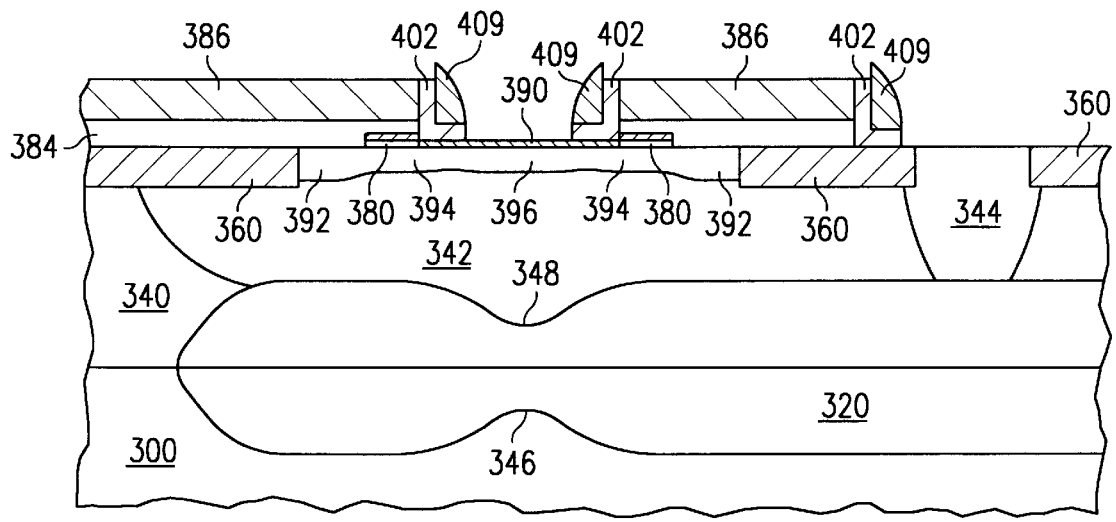
Figure 3M:
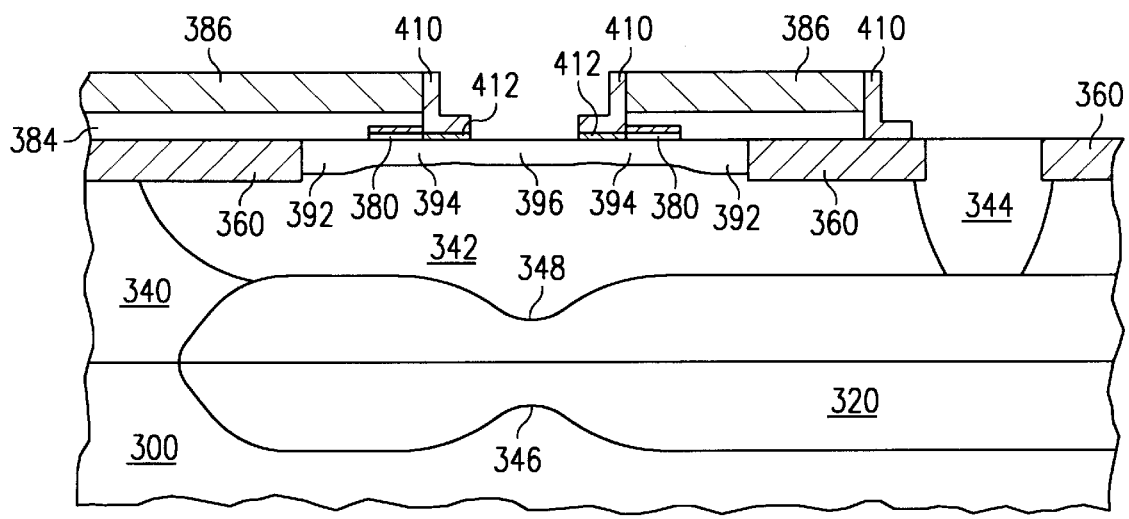
Figure 3N:
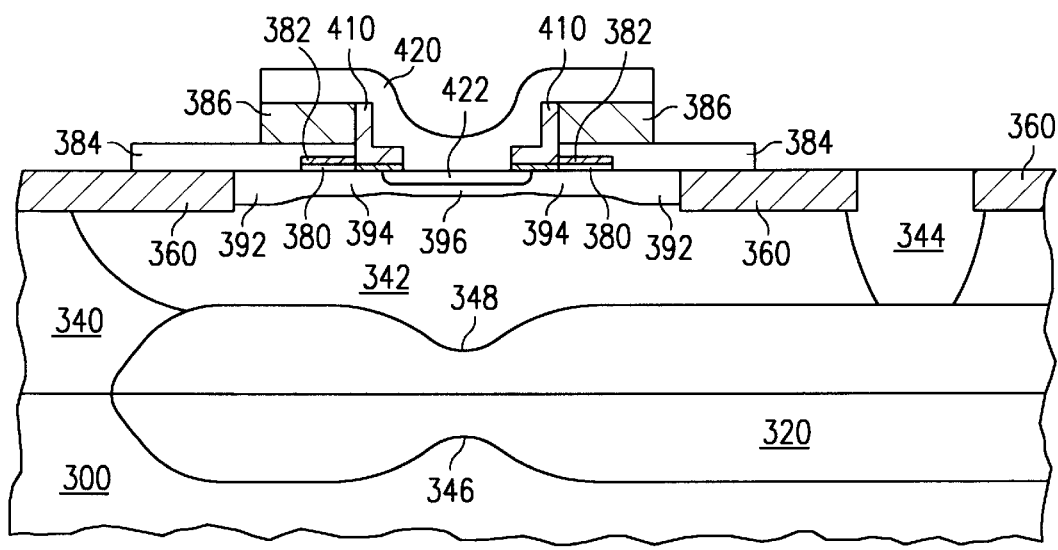

A process for fabricating a bipolar transistor in accordance with the invention is shown in FIGS. 3a to 3n. In FIG. 3a a semiconductor body 300, e.g. an epitaxial layer with p- doping, is shown after an implant step to form buried layer diffusion source regions 310 at the surface of the body. The ion implantation is performed with arsenic or similar dopant at a dose of about 6E15 ions/$cm^2$ at about 40 keV. The implantation mask 312 is photoresist having a thickness of about 1 um. The implant depth is about 50 nm. An alternative mask is a hardmask of silicon oxide with a thickness of about 800 nm. The oxide may be capped with a nitride of about 100 nm in thickness. The masked portion 314 of semiconductor body 300 is the ultimate location of the emitter and intrinsic base regions of the transistor. The portion of photoresist 312 covering this region is approximately 0.5 um in width.

FIG. 3b shows semiconductor body 300 following the removing of the photoresist 312 and following a high temperature anneal to diffuse the dopants both vertically and laterally within the semiconductor body. The diffusion anneal is performed at, for example, 1000° C. for approximately four hours. The depth of resulting buried layer 320 is about 500 nm. The lateral diffusion of dopants results in an overlapping of the two diffused regions. The overlap region 322 is about half the depth of the fully vertically diffused portions of region 320. Note that the ratio of overlap region thickness to fully vertically diffused region thickness is subject to the width of masked portion 314 in FIG. 3a, the diffusivity of the dopant, and the conditions used for the diffusion anneal. The preferred depth ratio of the overlap and fully vertically diffused regions in this embodiment is about one-half. The preferred depth ratio will typically fall within a range of about 0.3 to 0.6, but may be outside of this range depending upon the mean change in BVceo desired.

FIG. 3c shows the structure following the deposition of a second p- epitaxial layer 340 having a thickness on the order of 0.75 to 1.50 um. The surface of epitaxial layer 340 is patterned with photoresist or an oxide/nitride hardmask (not shown) and an implant is performed in preparation for the formation of n-well 342. The n-well implant may be performed by two implants using phosphorous, for example, at a dose of about 1E12 ions/$cm^2$ at about 70 keV, followed by a dose of about 1.2E12 ions/$cm^2$ at about 350 keV. Deep collector contact region is similarly formed with a phosphorous implant at a dose of 5E15 to 2E16 ions/$cm^2$ at about 150 keV. Following the n-well and collector contact implants, the dopants are driven with an anneal at about 1000° C. for about 150 minutes. This anneal also drives dopants in the buried layer into epitaxial layer 340 as shown in FIG. 3c. The indentation 346 in the buried layer profile is replicated as indentation 348 in the portion of the buried layer 320 that now lies in epitaxial layer 340.

Indentation 348 may be used advantageously to form a transistor with a relatively high BVceo using a process that is also capable of producing a transistor with a high cutoff frequency. The fabrication process described above, excluding the portion of masking layer 312 over masked portion 314, may be used to produce a transistor having high $f_T$. Consequently, the process is capable of producing both high breakdown voltage transistors and transistors with good high frequency performance. This may be done with no additional process cost, since the only difference in the fabrication processes of the two types of transistor is the masking layer 312 over masked portion 314. Masking layer 312 is used for both types of transistor to define the outer boundaries of the buried layer 320. The process for fabricating the high BVceo transistor simply relies on a different masking pattern for the buried layer implant shown in FIG. 3a.

Following the diffusion of the n-well, buried layer, and collector contact, shallow trench isolation regions 360 are formed at the surface of the structure. Note that alternative isolation techniques such as the local oxidation of silicon (LOCOS) and deep trench isolation may also be applied. Regions 360 are formed by etching shallow trenches at the surface of layer 340 and filling the trenches with a high density plasma deposited oxide. The thickness of the isolation trenches is about 670 nm.

The fabrication process for the embodiment transistor is shown here to incorporate a stacked barrier-diffusion source base link approach as described in coassigned U.S. Pat. No. 5,502,330 issued Mar. 26, 1996. Note that extrinsic base doping may alternatively be formed entirely from diffusion from the base electrode 384. Referring to FIG. 3e, a base-link diffusion source layer 380 is deposited over the structure of FIG. 3d to a thickness on the order of 50 nm. The base-link diffusion source layer 380 comprises a material that may be etched selectively with respect to silicon and that may function as a dopant source for a base link-up region to be formed later in the process. Base-link diffusion source layer 380 is preferably doped in situ or implant doped after deposition. For example, base-link diffusion source layer 380 may comprise borosilicate glass (BSG), phosphosilicate glass (PSG), or doped silicon germanium. The dopant concentration of base-link diffusion source layer 380 is determined by the desired resistance of the base link-up region to be subsequently formed.

A barrier layer 382 is deposited over base-link diffusion source layer 380 to a thickness in the range of 10 to 50 nm, but typically on the order of 30 nm. Barrier layer 382 comprises a material that protects layer 380 during subsequent processing steps such as clean-ups and photoresist strips. Barrier layer 382 preferably comprises a dielectric such as silicon oxide or silicon nitride. Layers 380 and 382 are then patterned and etched using, for example, an oversized replica of the emitter pattern. The desired etching chemistry for layer 380 is highly selective with respect to silicon. Suitable etch chemistries etch chemistries will be apparent to those skilled in the art.

Referring now to FIG. 3f, a first layer of polysilicon and an interpoly dielectric are deposited to a thickness on the order of 200 and 300 nm, respectively. The first layer of polysilicon may be doped in situ or implant doped after deposition to provide a low resistance layer. The first layer of polysilicon and the interpoly dielectric 386 are then etched as shown in FIG. 3f to form the base electrode 384. The interpoly dielectric etch stops on the polysilicon and the polysilicon etch stops on barrier layer 382 or base-link diffusion layer 380. As a result, the active or intrinsic region 388 of the transistor is protected from overetching and crystal damage. The base electrode 384 overlaps the ends of barrier layer 382 and base-link diffusion source layer 380. The amount of overlap varies by design, but may be on the order of 0.2 um. The pattern for layers 380 and 382 may overlap isolation regions 360 on one or more sides to reduce device active area. This leaves contact to the base region on less than four sides.

The exposed portion of barrier layer 382 and underlying base-link diffusion source layer 380 are then removed as shown in FIG. 3g. A selective dry etch, for example, that is highly selective to silicon may be used. This avoids damage to the transistor active area such as that which occurs when etching polysilicon directly off of silicon. This step is followed by an anneal cycle used to grow a screen oxide 390, while simultaneously diffusing the extrinsic base region 392 from the base electrode 384 and the base link-up region 394 from the remaining portions of base-link diffusion source layer 380 as shown in FIG. 3h. Because base link-up region 394 is diffused from base-link diffusion source layer 380, the dopant concentration of base link diffusion source layer 380 is adjusted to provide a low resistance base link-up region 394 without substantially affecting the resistance of base electrode 384. The surface concentration of dopant at the interface is preferably on the order of 5E19 atoms/cm$^3$. Referring to FIG. 3i, intrinsic base region 396 is implanted through screen oxide 390 and diffused.

The following several steps describe the formation of base-emitter spacers whose function it is to separate the edges of a subsequently formed emitter region from the edges of intrinsic base region 396. The edges of intrinsic base region 396 are coincident with the edges of the stack comprising polysilicon base electrode 384 and dielectric 386. The procedure depicted beginning in FIG. 3j results in an L-shaped spacer, as opposed to a dielectric sidewall as shown in aforementioned U.S. Pat. No. 5,502,330. As mentioned above, spacers are used to separate the emitter from the base in the transistor. However, typical $Si_3N_4$ base-emitter spacers result in emitter polysilicon depositions on the spacer sidewall that extend over the active emitter area, blocking a portion of the emitter dopant implant into the polysilicon directly over the emitter diffusion area. In addition, the resulting reduction in planar polysilicon area over the emitter can cause a high variability in the resistance of the emitter contacts formed in this region. L-shaped spacers, on the other hand, consume less volume and allow the implantation of dopants into the emitter polysilicon directly over the emitter region. The result is a uniform and consistent emitter junction depth and a reliable and low resistance emitter contact, regardless of patterned emitter size.

Referring to FIG. 3j, a layer of silicon nitride 402 having a thickness of about 70 nm is deposited to conformally cover the surface of the structure. The nitride layer 402 may be deposited with a low pressure chemical vapor deposition method, plasma enhanced chemical vapor deposition method, or similar suitable technique. The nitride layer is then covered with a material 404 having a good anisotropic etch selectivity to nitride and a high isotropic etch selectivity to oxide. The anisotropic etch selectivity ratio of material 404 to the nitride layer should be at least about 2:1, and the isotropic etch selectivity to oxide should be at least about 5:1. Examples of such materials include phosphorous-containing materials such as PSG or borophosphosilicate glass (BPSG). Using a material for layer 404 that is less etchselective to oxide and nitride incurs the risk that the active area of the epitaxial layer 340 will be etched during the subsequent removal of portions of layers 400, 402, and 404 in the dry etching steps. Another risk is that removal of portions of layer 404 will not be complete during the simultaneous removal of that layer and thermal oxide layer 390 during the wet deglaze etching unless layer 404 etches at a substantially higher rate than does layer 390.

In FIG. 3k, layer 404 has been anisotropically dry-etched to produce the sacrificial sidewalls 409 that ultimately define the emitter region diffusion width. The anisotropic etching may be achieved with reactive ion etching, for example, using an etch chemistry comprising $CHF_3:O_2$. The selectivity of the etching of layer 404 to the nitride layer 402 is important as a high degree of selectivity reduces the area dependence of the etch, the importance of overetch time selection, and trenching. Prior art techniques rely on silicon oxide deposited through the decomposition of tetraethyloxysilane (TEOS) for layer 404. However, TEOS oxide is not entirely conformal to the underlying nitride. This often results in there being less TEOS oxide over the emitter region than over the remainder of the structure. Consequently, the TEOS oxide overetches and forms trenches in the emitter region during the etch to clear the TEOS oxide remaining on the remainder of the structure. The TEOS oxide overetch then leads to overetching of the nitride in the emitter region since the nitride thinned by the overetch of the TEOS oxide. This is a particular problem since the etch selectivity of TEOS oxide to nitride is only about 1.5:1. The tendency to combat this problem is to rely on a thick (about 150 nm) nitride layer 402. The problem with that approach, however, is that a thicker spacer is produced, reducing the area for dopant implantation directly above the emitter and resulting in narrow emitter effects.

In contrast, the dry-etch selectivity of PSG and BPSG to nitride is approximately twice that of TEOS oxide. This allows the use of a thinner nitride layer 402 to produce a thinner spacer, while still providing protection against the overetching of underlying layers.

In FIG. 3l, the portions of nitride layer 402 not covered by the PSG or BPSG sacrificial sidewalls 409 are removed with a reactive ion etching process using a chemistry comprising $CF_4:CHF_3:O_2$, for example. The nitride etch stops on the thermal oxide layer 390. The resulting structure is an L-shaped nitride spacer still covered by the PSG or BPSG sidewalls 409. The sidewalls 409 and the thermal oxide layer 390 that covers the intrinsic base region 396, and subsequently the emitter region, are then removed in a deglaze (wet etching) step using a 10% HF, for example.

The prior art use of TEOS oxide for layer 404 again makes these steps difficult. The wet etch rate ratio of TEOS oxide to thermal oxide is only about 2:1. Thus, when the thermal oxide layer 390 is removed in the deglaze step, not all of the TEOS is removed because of the large difference in thickness between thermal oxide layer 390 and the sacrificial TEOS sidewalls that cover the nitride. Thus, the prior art approach risks either leaving TEOS on the nitride after the deglaze step, or overetching the thermal oxide to ensure that the TEOS is cleared from the nitride. Leaving TEOS on the nitride spacer is undesirable because of the narrow emitter effects that can result from a thick spacer. Overetching the thermal oxide 390 is undesirable because some of layer 412 can be removed, resulting in an exposed base-emitter junction. The exposed base-emitter junction may fill with emitter poly and result in a leaky base-emitter junction.

In contrast, the use of PSG or BPSG, both of which have an etch rate ratio to thermal oxide approximately five times that of TEOS oxide, allows complete removal of the sacrificial sidewalls 409 from the nitride 402 without substantially overetching the thermal oxide 390. The resulting structure is shown in FIG. 3m. The base-emitter spacers comprise a nitride "L" 410 that remains of layer 402, and the underlying thermal oxide 412 that remains of the layer 390.

The emitter of the transistor is formed by depositing a second layer of polysilicon to a thickness on the order of 250 nm. The second polysilicon layer may be doped in-situ or implant doped after deposition. The preferred method is implant doping of arsenic with a dose of about 1E16 ions/cm$^2$ at about 100 keV. The second polysilicon layer is then patterned and etched to form emitter electrode 420.

Emitter region 422 is diffused approximately 40 nm into the surface of epitaxial layer 340 from the emitter electrode 420 by rapid thermal annealing at about 1050° C. for about 10 seconds. This diffusion may alternatively be done prior to the etching of the second polysilicon layer to form the emitter electrode.

Figure 4:
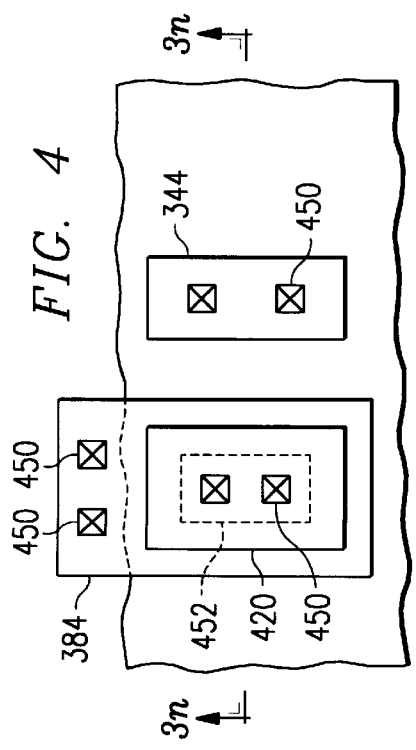
FIG. 4 is a plan view of the embodiment transistor shown in FIG. 3n.

FIG. 4 is a plan view of the transistor shown in cross-section in FIG. 3n. The emitter electrode 420 and base electrode 384, as well as the collector contact 344 are shown with representative contact points 450 indicated. Element 452 is the inside boundary of the L-shaped spacer. A low resistance contact is achieved by siliciding the polysilicon electrode or silicon contact. Multilevel metallization may be used in a conventional manner to couple the transistor to other circuits.

Figure 5:
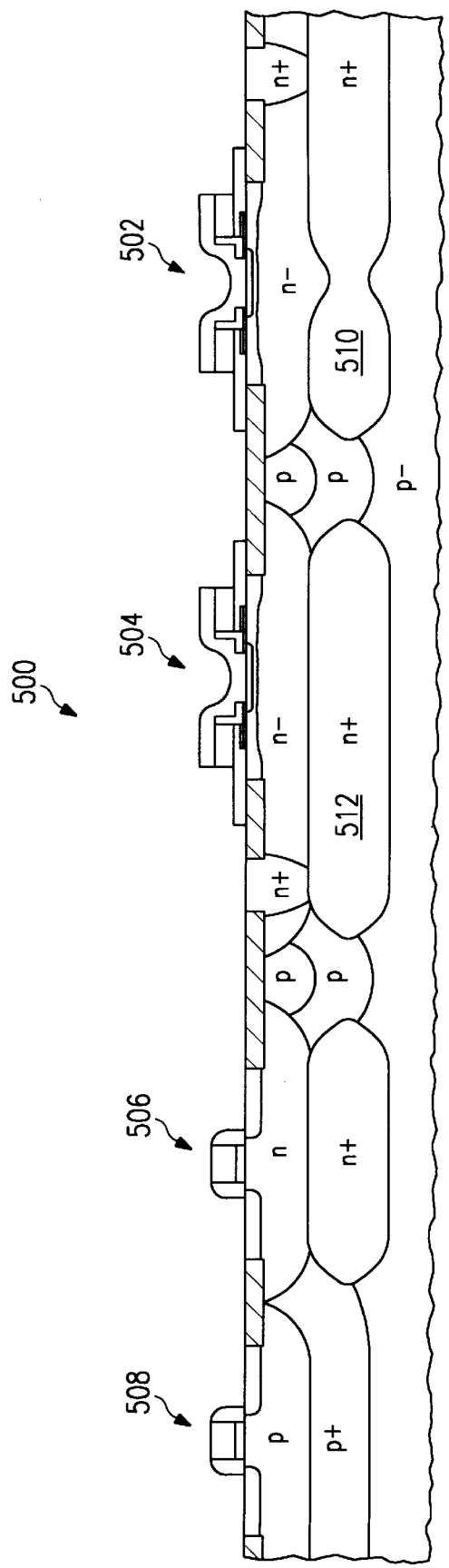
FIG. 5 is a cross-sectional diagram of an integrated circuit comprising the embodiment transistor of FIG. 3n as well as a conventional bipolar transistor and CMOS p-channel and n-channel transistors.

FIG. 5 shows a BiCMOS implementation 500 in which the transistor 502 of FIG. 3n is integrated with a bipolar transistor 504 having a conventional buried layer, a CMOS p-channel transistor 506, and a CMOS n-channel transistor 508. Transistor 502 has relatively high breakdown characteristics due to the indentation in the buried layer 510. In contrast, transistor 504 has a relatively high cutoff frequency, $f_T$, due to its uniform buried layer 512.

While this invention has been described with reference to illustrative embodiments, this description is not intended to be construed in a limiting sense. For example, the invention was described with reference to a double polysilicon bipolar transistor formed using a BiCMOS process. It will be apparent to those skilled in the art that the innovations are also applicable to other BiCMOS processes and devices, as well as to bipolar processes and devices. Various modifications and combinations of the illustrative embodiments, as well as other embodiments of the invention, will be apparent to persons skilled in the art upon reference to the description. It is therefore intended that the appended claims encompass any such modifications or embodiments. The circuits and devices described herein may be implemented in silicon-based integrated circuits or in compound semiconductor integrated circuits.

What is claimed is:

1. A method for fabricating a spacer in a transistor, comprising the steps of:

forming a stepped feature at a semiconducting surface of a body, said stepped feature having a lateral face substantially parallel to said surface and an angled edge substantially perpendicular to said surface;

forming a screen dielectric layer in a contact opening location of the surface, adjacent the angled edge of the stepped feature;

forming an insulating layer over said lateral face and angled edge of said stepped feature, and over the screen dielectric layer in the contact opening location;

forming a sacrificial layer over said insulating layer;

removing the portion of said sacrificial layer over said lateral face to expose portions of said insulating layer and to leave a remaining portion of said sacrificial layer along said angled edge of said stepped feature;

removing said exposed portions of said insulating layer; and simultaneously etching the screen dielectric layer and remaining portion of said sacrificial layer;

wherein the sacrificial layer is comprised of a material that etches, in the etching step, at a rate that is substantially higher than twice the rate at which the material of the screen dielectric layer etches in the etching step, so that the etching step removes both the screen dielectric layer from the contact opening location and also the remaining portions of the sacrificial layer from along said angled edge of said stepped feature.

2. The method of claim 1, wherein said stepped feature comprises a polysilicon base electrode.

3. The method of claim 1, wherein said insulating layer comprises silicon nitride.

4. The method of claim 1, wherein said sacrificial layer comprises phosphorous-doped silicon dioxide;

and wherein the screen dielectric layer comprises silicon dioxide.

5. The method of claim 4, wherein said phosphorous-doped silicon dioxide comprises phosphosilicate glass.

6. The method of claim 4, wherein said phosphorous-doped silicon dioxide comprises borophosphosilicate glass.

7. The method of claim 1, wherein said sacrificial layer etches, in the etching step, at a rate that is about five times the rate at which the material of the screen dielectric layer etches in the etching step.

8. A method for fabricating a bipolar transistor, comprising the steps of:

forming a base electrode structure, including a base electrode, at a semiconducting surface of a body, said base electrode structure extending from said surface and having an edge substantially perpendicular to said surface at an emitter opening;

forming a screen dielectric layer over the emitter opening;

forming a doped base region into said surface at the emitter opening and through the screen dielectric layer said base region substantially aligned with the edge of said base electrode structure;

forming an insulating layer over said surface and said base electrode structure, said insulating layer covering said edge of said base electrode structure and covering the screen dielectric layer over the emitter opening;

forming a sacrificial layer over said insulating layer;

removing said sacrificial layer from said surface and said base electrode structure but leaving a remaining portion of said sacrificial layer covering said insulating layer along the edge of said base electrode structure;

removing portions of said insulating layer left uncovered by said sacrificial layer after the step of removing said sacrificial layer;

simultaneously etching the screen dielectric layer and the remaining portion of said sacrificial layer; and forming an emitter electrode at the emitter opening of said surface, wherein said insulating layer along the edge of said base electrode structure insulates said base electrode from said emitter electrode;

wherein the sacrificial layer is comprised of a material that etches, in the etching step, at a rate that is substantially higher than twice the rate at which the material of the screen dielectric layer etches in the etching step, so that the etching step removes both the screen dielectric Layer from the emitter opening location and also the remaining portions of the sacrificial layer from along the edge of said base electrode structure.

9. The method of claim 8, wherein said insulating layer comprises silicon nitride.

10. The method of claim 8, wherein said sacrificial layer comprises a phosphorous-doped silicon dioxide;

and wherein the screen dielectric layer comprises silicon dioxide.

11. The method of claim 8, wherein said phosphorous-doped silicon dioxide comprises phosphosilicate glass.

12. The method of claim 8, wherein said phosphorous-doped silicon dioxide comprises borophosphosilicate glass.

13. The method of claim 8, wherein said sacrificial layer etches, in the etching step, at a rate that is about five times the rate at which the material of the screen dielectric layer is etched in the etching step.

14. The method of claim 8, wherein the step of forming an emitter electrode comprises:

forming a doped polysilicon layer over the emitter opening location; and diffusing dopant from the doped polysilicon layer into the surface at the emitter opening location.

15. The method of claim 14, wherein the step of forming a doped polysilicon layer comprises:

depositing a doped polysilicon layer overall; and patterning the deposited doped polysilicon layer to form the emitter electrode.

16. The method of claim 14, wherein the step of forming a doped polysilicon layer comprises:

depositing a polysilicon layer overall;

doping the deposited polysilicon layer;

patterning the deposited doped polysilicon layer to form the emitter electrode.

* * * * *

UNITED STATES PATENT AND TRADEMARK OFFICE
CERTIFICATE OF CORRECTION

PATENT NO. : 6,130,136
DATED : October 10, 2000
INVENTOR(S) : Frank S. Johnson and Peter S. McAnally It is certified that error appears in the above-identified patent and that said Letters Patent is hereby corrected as shown below:

Title page,
On the left column under "Filed: Feb. 13, 1998" insert: -- Related U.S. Application Data Provisional application No. 60/066,258, Nov. 20, 1997 --.

Column 1,
After line 3, insert: -- This application claims priority under 35 USC 119 (e)(1) of provisional application Serial No. 60/066,258, filed Nov. 20, 1997. --

Signed and Sealed this

Eighteenth Day of September, 2001

*Attest:*

*Attesting Officer*

NICHOLAS P. GODICI
*Acting Director of the United States Patent and Trademark Office*